United States Patent [19]

Baisuck

[11] Patent Number: 5,812,415
[45] Date of Patent: Sep. 22, 1998

[54] METHOD AND APPARATUS FOR ENHANCING PERFORMANCE OF DESIGN VERIFICATION SYSTEMS

[75] Inventor: Allen Baisuck, San Jose, Calif.

[73] Assignee: Cadence Design Systems, Inc., San Jose, Calif.

[21] Appl. No.: 630,957

[22] Filed: Apr. 5, 1996

[51] Int. Cl.⁶ .................................................. G06F 17/50
[52] U.S. Cl. ......................... 364/490; 364/489; 364/491
[58] Field of Search ................................... 364/488–491, 364/578

[56] References Cited

U.S. PATENT DOCUMENTS

| | | | |
|---|---|---|---|
| 5,416,722 | 5/1995 | Edwards | 364/491 |
| 5,440,720 | 8/1995 | Baisuck et al. | 395/500 |
| 5,519,628 | 5/1996 | Russell et al. | 364/489 |
| 5,629,861 | 5/1997 | Kim | 364/490 |

OTHER PUBLICATIONS

Allan ("Hierarchical Critical Area Extraction with the Eye Tool," IEEE comput. Soci. Press, Proceedings of the IEEE International WOrkship on Defect and Fault Tolerance in VLSI Systems, pp. 28–36), Nov. 1995.

Nair ("Restructuring VLSI Layout Representations for Efficiency," IEEE Comput. Soc. Press. Proceedings of European Conference on Design Automation, pp. 111–116, Feb. 1991.

Shiran ("YNCC/Sub DB/: A New Database Representation of VLSI Circuits for Fast Navigation and Layout Verification Applications", IEEE Comput. Soc. Press. CompuEuro 88—System Design: Concepts, Methods and Tools. Apr. 1988, pp. 150–155).

Lin et al. ("A Circuit Disassembly Technique for Synthesizing Symbolic Layouts from Mask Descriptions", IEEE Transactions on Computer–Aided Design of Integrated Circuits and Systems, vol. 9, No. 9, Sep. 1990, pp. 959–968), Sep. 1990.

*Primary Examiner*—Emanuel Todd Voeltz
*Assistant Examiner*—Phallaka Kik
*Attorney, Agent, or Firm*—Townsend and Townsend and Crew LLP

[57] ABSTRACT

A method implemented on a computer system for enhancing performance of an integrated circuit design verification system, the computer system having a memory including a circuit design, the circuit design including a base layer, a first layer, a second layer, a first derived layer, and a second derived layer, the first derived layer defined in response to operation between the base layer and the first layer, the second derived layer defined in response to an operation between the second layer and the first derived layer, includes the steps of retrieving the first layer from the memory, the first layer located within the base layer, deriving a negative first derived layer in response to the first layer, the negative first derived layer being a negative domain representation of the first derived layer, and verifying the circuit design in response to the negative first derived layer.

29 Claims, 4 Drawing Sheets

METHOD AND APPARATUS FOR ENHANCING PERFORMANCE OF DESIGN VERIFICATION SYSTEMS

BACKGROUND OF THE INVENTION

The present invention relates generally to design verification systems, and more specifically to integrated circuit (IC) mask verification systems.

MASK LAYER DESIGN VERIFICATION

The fabrication of integrated circuits (IC) is dependent upon the creation of a set of "masks" used during the fabrication process. Each mask in the set represents a different step in the fabrication, typically addition or deletion of material. A digitized representation of an image of a mask is commonly called a "mask layer" or simply a "layer". Each layer is comprised of a set of geometric shapes representing the desired configuration of materials such as metal, polysilicon, or substrate in a finished IC. For example, layers can represent the deposition of metal, or the etching away of resistive material between two layers of metal so that a "via" is opened.

Commercially available software products perform tests on the layers, such as testing the veracity of a set of "design rules," with operations known as "design rule checks" (DRCs). One or more DRCs are applied to the geometric shapes of each layer, directly by measuring the shapes and their relationships, or indirectly by creating intermediate layers (also known as "derived layers"). Derived layers often are more amenable to design rule checking than the original layers, and can be used in the creation of subsequent derived layers.

Typically, derived layers are created using "scan line" algorithms which are well known to one skilled in the art. Scan line algorithms are based upon using edges of geometric objects within a layer to determine where two layers overlap or how far apart the geometric objects are. Depending upon the operation, such as an AND or an OR, etc., the overlap will have different significance to the layer derived from the combination. Conventional pixel by pixel operations between layers is not typically performed because of the high pixel resolution typically used. For example, in a layer, every micron may be represented by approximately one thousand pixels, thus for every square micron in a layer, about one million operations would have to be performed. Scan line and other algorithms reduce the number of operations required.

The number of geometric shapes needed to represent an image of an advanced IC is in the hundreds of millions, or billions, and is climbing with advancing fabrication technology. As a result, methods are being created to reduce the amount of data processing needed for designing IC's and for performing DRC and other verification-related tasks. One such method is "hierarchical analysis", in which the "cells" of a design are verified individually within a cell context. The full "flat" representation of the IC, however, is typically not checked during the design phase nor the verification phase of the IC's creation.

LAYER OPERATIONS

In the hierarchical DRC of a design, one important step is the determination and assessment of the interrelationships among cells that are referenced by at least one common ancestor. Such cells are called the "progeny" of that ancestor, for convenience. Part of the determination of the relationships among progeny involves dealing with the overlap and abutment of shapes in the progeny. When progeny overlap or abut (or are even "too close") then the shapes in them may overlap (or abut or be too close) and the effects of this relationship must be evaluated with respect to the design rules being tested. A base layer (substrate) is, by definition, "everywhere" on the chip. It is the base material upon which all other materials are deposited in the fabrication of an IC, thus the base layer exists in overlapping or abutting progeny by definition.

"Layer operations" on original layers are well-understood by those involved in IC verification using scan line and other processing methods. It is also well-known and understood that certain operations involving the base layer result in highly complex layer representations because the base layer is "everywhere." For example, when the computer derives a "derived layer" according to the rule "baseLayer AND NOT someLayer", the result is a large polygon with "holes" in all locations occupied by someLayer. If someLayer is complex, the derived layer typically is even more complex. Deriving other layers from previously derived, complex layers typically results in even more complexity. This increase in complexity impacts the user by increasing the amount of computer processing time required for design verification.

Two exemplary classes of operations involved in the design-rule verification of IC mask sets are a logical "AND NOT" operation and a logical exclusive OR ("XOR") operation. These operations have the effect of "subtracting" one set of shapes from another set of shapes. For example: layer 3=layer 1 AND NOT layer 2 results in layer 3 being equal to layer 1 with openings where layer 2 is present.

ILLUSTRATION

Figure 1A:
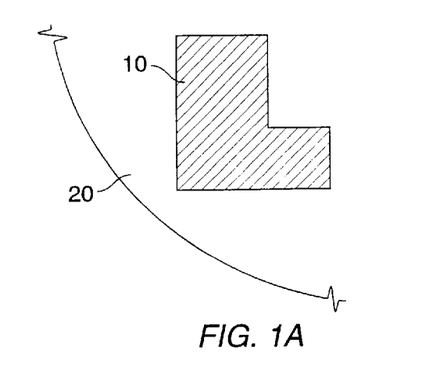
FIGS. 1A–E illustrate sample mask layers that are used for production of a MOS transistor.
Figure 1B:
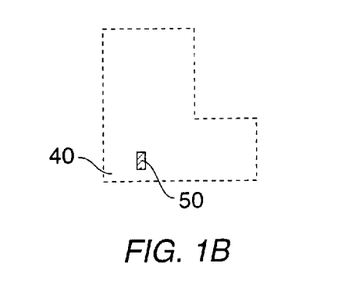
Figure 1C:
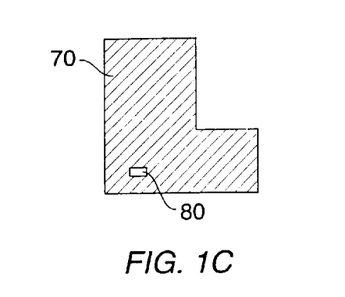
Figure 1D:
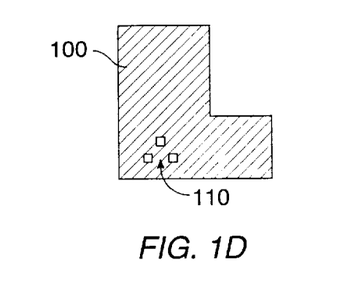
Figure 1E:
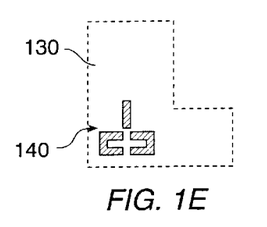

FIGS. 1A–E illustrate sample mask layers that are used for production of a MOS transistor. FIG. 1A illustrates a base layer 10 of a substrate 20 that is of interest in a circuit. FIG. 1B illustrates a mask layer 40 that is used to define where a gate oxide 50 is to be defined. FIG. 1C illustrates a mask layer 70 that is used to define where self-aligning source and drain regions 80 are to be located. FIG. 1D illustrates a mask layer 100 that is used to define contact points 110 to the MOS transistor. FIG. 1E illustrates a mask layer 130 that is used to define contacts 140 for the MOS transistor. In the figures, the shaded regions represent the existence of material whereas the un-shaded regions represent the absence of material. In FIGS. 1B and 1E, base layer 10 is shown in dotted lines for comparison purposes.

Figure 2:
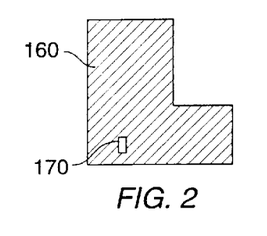
FIG. 2 illustrates a result of a typical AND NOT logical operation between mask layers.

FIG. 2 illustrates a result of a typical AND NOT logical operation between mask layers. FIG. 2 includes a derived mask layer 160 including an opening 170. As can be easily seen, derived mask layer 160 is derived from the logical AND NOT operation of base layer 10 and gate oxide 50 of mask layer 40.

Figure 3:
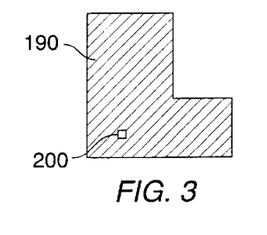
FIG. 3 illustrates a result of a typical OR logical operation between mask layers.

FIG. 3 illustrates a result of a typical OR logical operation between mask layers. FIG. 3 includes a derived mask layer 190 including opening 200. As can be easily seen, derived mask layer 190 is derived from the logical OR operation between derived mask layer 160 and mask layer 100. In this example, opening 200 represents the metal connect for the gate of the MOS transistor.

What is needed are methods and apparatus which reduce computer processing time for design verification of IC designs.

SUMMARY OF THE INVENTION

The present invention provides methods and apparatus for enhancing performance of design verification systems.

According to a preferred embodiment of the present invention a method implemented on a computer system for enhancing performance of an integrated circuit design verification system includes the steps of retrieving a first layer from a memory, the first layer located within a base layer, and deriving a negative derived layer in response to the first layer, the negative derived layer being an inverse representation of a derived layer. The method also includes the step of verifying the circuit design in response to the negative derived layer.

According to another embodiment of the present invention a computer system is configured to enhance performance of an integrated circuit design verification system, the computer system includes a memory including a circuit design, the circuit design including a base layer, a first mask layer, a second mask layer, a first derived layer, and a second derived layer, the first derived layer defined in response to an operation between the base layer and the first mask layer and the second derived layer defined in response to an operation between the second mask layer and the first derived layer, and a retriever for retrieving the first layer from the memory, the first layer located within the base layer. The computer system also includes a deriver for deriving a negative first derived layer in response to the first layer, the negative first derived layer being an inverse of the first derived layer, and a verifier for verifying the circuit design in response to the negative first derived layer.

BRIEF DESCRIPTION OF THE DRAWINGS

In order to more fully understand the present invention, reference is made to the accompanying drawings. Understanding that these drawings are not to be considered limitations in the scope of the invention, the presently preferred embodiments and the presently understood best mode of the invention are described with additional detail through use of the accompanying drawings in which.

DETAILED DESCRIPTION

System Configuration

Figure 4:
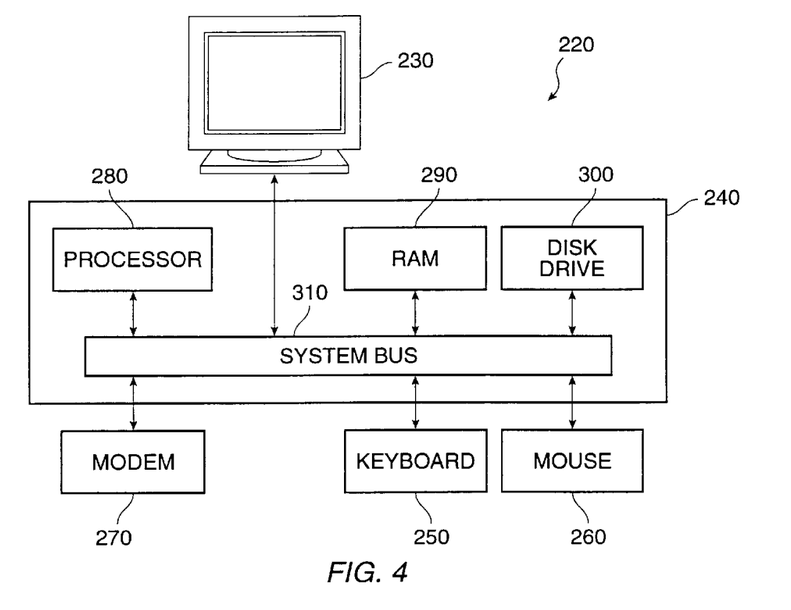
FIG. 4 is a block diagram of a system according to a preferred embodiment of the present invention.

FIG. 4 is a block diagram of a system 220 according to a preferred embodiment of the present invention. System 220 includes, preferably, a display monitor 230, a computer 240, a keyboard 250, a mouse 260, and a modem 270. Computer 240 includes familiar computer components such as a processor 280, memory storage devices such as a random access memory (RAM) 290 and a disk drive 300, and a system bus 310, interconnecting the above components. Mouse 260 is but one example of a graphical input device; a trackball is another example. Modem 270 is but one example of a device enabling system 220 to be coupled to a network; a network interface card is another example. RAM 290 and disk drive 300 are examples of computer-readable memory (tangible media) for storage of the herein described computer code and computer programs; other types of computer-readable media include floppy disks, removable hard disks, optical storage media such as CD-ROMS and bar codes, and semiconductor memories such as flash memory and read-only-memories (ROMs).

In a preferred embodiment, system 220 includes an UltraSparc computer running the Solaris operating system from Sun Microsystems of Sunnyvale, Calif. and Vampire software from Cadence Design Systems, Inc.

FIG. 4 is representative of but one type of system for embodying the present invention. It will be readily apparent to one of ordinary skill in the art that many system types and hardware and software configurations including more or fewer components are suitable for use in conjunction with the present invention, such as an HP-755/125 computer from Hewlett-Packard Corporation.

Description of the Preferred Embodiment

In the preferred embodiment of the present invention a physical lay-out of a circuit design is initially resident in a memory storage device in a computer system. A typical circuit design includes layers or images of masks that are used for production purposes within a particular region in a substrate. The particular region may or may not span an entire substrate, thus preferably the term "base layer" will be used herein. For example, a base layer may span an entire semiconductor substrate region of a circuit design, the base layer may span only a portion of the semiconductor substrate region where a particular circuit "cell" of interest is being verified, or the base layer may span portions of the semiconductor substrate region where particular circuit "cells" of interest are being verified, etc.

In the present example, a circuit design including a base layer, a first layer, and a second layer is provided. Based upon these layers, a design verification system determines that a first derived layer should be formed by the combination of the base layer and a first layer, and a second derived layer should be formed by a combination of the first derived layer and a second layer. Exemplary combinations of the base layer and the first layer are AND NOT and XOR.

Figure 5:
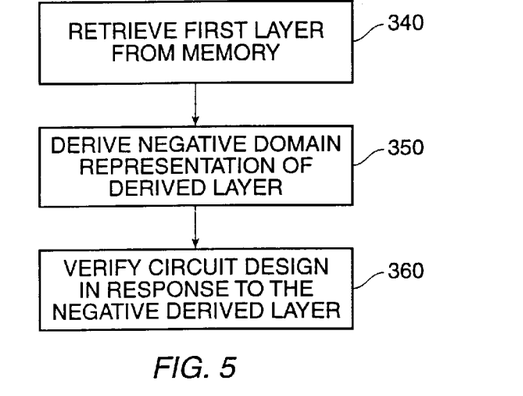
FIG. 5 illustrates a flow diagram of the preferred embodiment of the present invention.

FIG. 5 illustrates a flow diagram of the preferred embodiment of the present invention. In the preferred embodiment, a circuit design includes a base layer and a first layer.

Initially the first layer having geometric shapes resident within the base layer are retrieved from memory, step 340. Next, the computer derives a negative domain representation of a derived layer, step 350. In the preferred embodiment of the present invention, the negative domain representation, a negative derived layer, is set equal to the first layer when a logical ANDNOT or XOR operation is required between the base layer and a first layer.

The negative derived layer is a "negative domain" representation of a derived layer. For example, where the derived layer exists, the negative derived layer does not exist, and vice versa. In the preferred embodiment of the present invention, the derived layer is said to reside in the "positive" domain, the negative derived layer resides in the "negative" domain.

Next, given that a negative derived layer was calculated, instead of conventionally only the derived layer, the computer verifies the circuit design in response to the negative derived layer, step 360. In other words, the circuit design is verified using the layer derived in the "negative" domain. Because certain layers in the negative domain are lower in complexity than layers in the positive domain, calculations based upon layers in the negative domain are faster than calculations based upon the layers in the positive domain. Verification of the circuit design is thus enhanced.

Figure 6:
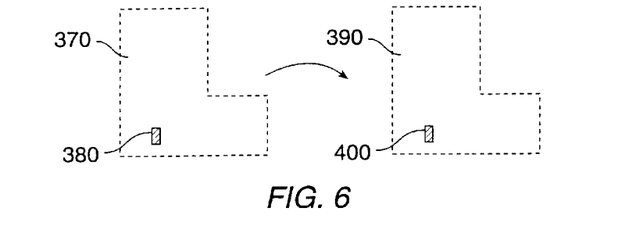
FIG. 6 illustrates an example of the method disclosed in FIG. 5.

FIG. 6 illustrates an example of the method disclosed in FIG. 5. FIG. 6 includes a first layer 370 including portion 380, similar to FIG. 1B, and a negative derived layer 390 including portion 400. According to the method in FIG. 5, when the logical combination of a base layer (not shown) ANDNOT first layer 370 is required to form a derived layer, the negative derived layer 390 is formed instead. Here, negative derived layer 390 is equal to first layer 370. In FIG. 5, the outline of the portion of interest is shown for convenience.

As was illustrated in FIG. 2, derived layer 160 was derived from the logical combination of base layer 10 in FIG. 1A AND NOT layer 40 in FIG. 1B. Comparing negative derived layer 390 in FIG. 6 to derived layer 160 in FIG. 2, it can be readily seen that negative derived layer 390 is less "complex" (as will be defined) than derived layer 160. Because there is less complexity, negative derived layer 390 may be used to verify the circuit design more efficiently than derived layer 160.

Complexity can be defined in terms of the number of "edges" present in each layer in light of the fact that edges are used for scan line algorithms, as previously mentioned. For example, negative derived layer 390 has 4 edges (the perimeter of portion 400), and derived layer 160 has 10 edges (the perimeter and opening 170). Another calculation of complexity may be the length of edges in the derived layers. For example negative derived layer 390 would have a length equal to the perimeter of portion 400 whereas derived layer 160 would have a length equal to the perimeter of derived layer 160 plus the perimeter of opening 170.

Other measures of complexity are easily foreseeable based upon the different algorithms used. For example, one alternative to operating upon edges (using scan-line algorithms), is operating upon trapezoidal shapes and dividing layers up into trapezoidal shapes. Using this alternative, complexity is measured in terms of the number of trapezoids in a layer, as illustrated below.

Figure 7A:
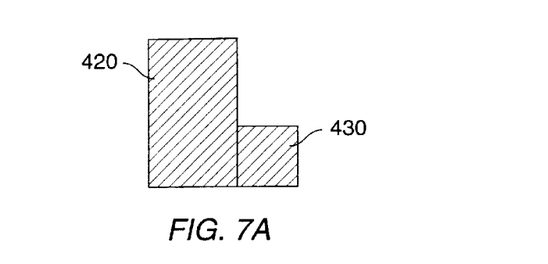
FIGS. 7a–c illustrate the concept of complexity as applied to a mask layer algorithm based upon trapezoidal shapes.
Figure 7B:
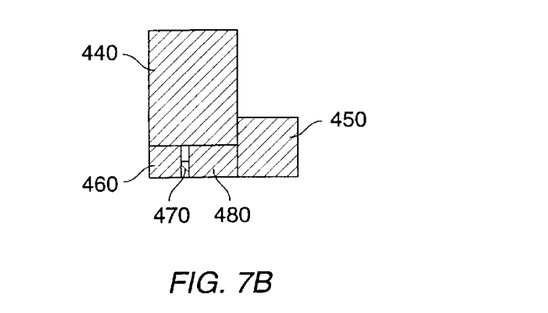
Figure 7C:
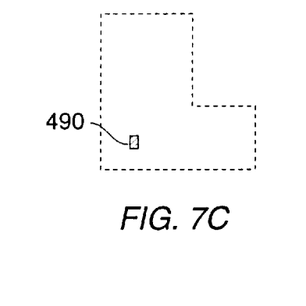

FIGS. 7A–C illustrate the concept of complexity as applied to a mask layer algorithm based upon trapezoidal shapes. FIG. 7a illustrates trapezoids representing layer base layer 10 in FIG. 1A. FIG. 7a includes two trapezoids 420 and 430. FIG. 7b illustrates trapezoids representing derived layer 160 in FIG. 2. FIG. 7b includes five trapezoids 440, 450, 460, 470, and 480. FIG. 7c illustrates trapezoids representing negative derived layer 390 in FIG. 6. FIG. 7c includes one trapezoid 490. Comparing FIGS. 7b and 7c it can be seen that calculations based in the negative domain have approximately a five-fold decrease in complexity as compared to the positive domain.

In practice, there has been significant improvement in the speed of design verification. It is believed that the preferred embodiment of the present invention, described herein, is attributable to the decrease in the complexity of the mask layers used for design rule checking.

Figure 8:
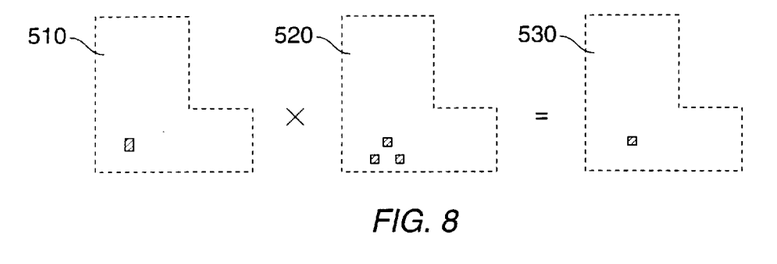
FIG. 8 illustrates a further example of the present invention.

FIG. 8 illustrates a further example of the present invention. FIG. 8 illustrates a negative derived layer 510, a negative layer 520, and a negative derived layer 530.

In the present example, negative derived layer 530 is the negative domain representation of derived layer 190. As was illustrated in FIG. 3, derived layer 190 was derived from the logical combination of derived layer 160 OR layer 100 in FIG. 1D. Comparing negative derived layer 530 in FIG. 8 to derived layer 190 in FIG. 3, it can be readily seen that negative derived layer 530 is also less "complex" than derived layer 190 (as defined above). Because there is less complexity, negative second derived layer 530 may also be used to verify the circuit design more efficiently than derived layer 190.

In FIG. 8, negative derived layer 530 is formed by performing calculations within the negative domain. Negative derived layer 510, for example is formed from the logical combination of base layer 10 AND NOT 40 as was illustrated in FIG. 6, and negative layer 520 is the negative domain representation of layer 100 in FIG. 1D. The logical combination of derived layer 160 OR layer 100 is a positive domain representation, and the logical combination of negative derived layer 510 AND negative layer 520 is a negative domain representation.

Thus, FIG. 8 illustrates that performing design rule checking within "the negative domain" is advantageous often when the complexity of the negative domain representation is less than the complexity of the corresponding "normal" or "positive" layer or derived layer. In the preferred embodiment, the user does not calculate both a positive domain representation and a negative domain representation for each operation, instead the domain is determined preferably according to which domain the operands happen to be calculated in.

Conventional DRC operations are typically performed in the positive domain and typically avoid the negative domain. Because users do not typically think in the negative domain, the conversion from positive to negative domain using the described methods, is performed transparently to the user. Examples of this are described below:

In the following examples, A, B, and C are mask layers:

If the DRC requires C=B ANDNOT A, and B has only been calculated in the negative domain (B*), using known logical manipulation, C* (C in the negative domain)=B* OR A. Similarly if A has only been calculated in the negative domain (A*), using known logical manipulation, C (C in the positive domain)=B AND A*. Further if A and B are only calculated in the negative domain (A* and B*), using known logical manipulation, C=A* ANDNOT B*. In the first case only C* is calculated, as a result, subsequent layers derived from C are transparently manipulated to be derived from C*; in the last two cases C is calculated so that subsequent layers derived from C are unaffected.

If the DRC requires C=B OR A, and B has only been calculated in the negative domain (B*), using known logical manipulation, C* (C in the negative domain)=B* ANDNOT A. Similarly if A has only been calculated in the negative domain (A*), using known logical manipulation, C* (C in the negative domain)=A* ANDNOT B. Further if A and B are only calculated in the negative domain (A* and B*), using known logical manipulation, C*=A* AND B*. In all three cases only C* is calculated, as a result, layers derived from C are transparently manipulated to be derived from C*.

If the DRC requires C=B AND A, and B has only been calculated in the negative domain (B*), using known logical manipulation, C (C in the positive domain)=A ANDNOT B*. Similarly if A has only been calculated in the negative domain (A*), using known logical manipulation, C (C in the positive domain)=B ANDNOT A*. Further if A and B are only calculated in the negative domain (A* and B*), using known logical manipulation, C*=A* OR B*. In the first two cases C is calculated so that subsequent layers derived from C are unaffected; in the last case only C* is calculated, as a result, subsequent layers derived from C are transparently manipulated to be derived from C*.

If the DRC requires C=B XOR A, and B has only been calculated in the negative domain (B*), using known logical manipulation, C* (C in the negative domain)=(A ANDNOT B*) OR (B* ANDNOT A). Similarly if A has only been calculated in the negative domain (A*), using known logical manipulation, C* (C in the negative domain)=(A* ANDNOT B) OR (B ANDNOT A*). Further if A and B are only calculated in the negative domain (A* and B*), using known logical manipulation, C*=(A* ANDNOT B*) OR (B* ANDNOT A*). In the first two cases C* is calculated, as a result, subsequent layers derived from C are transparently manipulated to be derived from C* in the last case C is calculated so that the subsequent layers derived from C are unaffected.

Conclusion

In the foregoing specification, the invention has been described with reference to specific exemplary embodiments thereof. Many changes or modifications are readily envisioned. For example, not only boolean (logical) operations lend themselves to this technique. Other operations such as a first layers "insideness" with respect to a second layer can be performed in the negative domain by testing the "outsideness" of the first layer with respect to the "negative" of the second layer; as well as testing for abutment.

The specification and drawings are, accordingly, to be regarded in an illustrative rather than in a restrictive sense. It will, however, be evident that various modifications and changes may be made thereunto without departing from the broader spirit and scope of the invention as set forth in the claims.

What is claimed:

1. A method implemented on a computer system for enhancing performance of an integrated circuit design verification system, the computer system having a memory storing a circuit design, the circuit design including a base layers a first layer, a second layer, a first derived layer, and a second derived layer, the first derived layer defined in response to an operation between the base layer and the first layer, the second derived layer defined in response to an operation between the second layer and the first derived layer, the method comprising the steps of:

retrieving the first layer from the memory, the first layer located within the base layer;

deriving a negative first derived layer in response to the first layer, the negative first derived layer being a negative domain representation of the first derived layer, wherein the operation between the base layer and the first layer and on the negative first derived layer is chosen from the set: AND NOT, XOR, and INSIDENESS; and verifying the circuit design in response to the negative first derived layer.

2. The method of claim 1, further comprising the steps of:
   retrieving the second layer from the memory, the second layer located within the base layer;
   deriving the second derived layer in response to the negative first derived layer and the second layer, and
   verifying the circuit design in response to the second derived layer.

3. The method of claim 1, further comprising the steps of:
   retrieving the second layer from the memory, the second layer located within the base layer;

deriving the negative second derived layer in response to the negative first derived layer and the second layer, and
   verifying the circuit design in response to the negative second derived layer.

4. The method of claim 1, wherein the circuit design also includes a plurality of derived layers defined in response to the first derived layer, the method further comprising the step of:
   deriving the plurality of derived layers in response to the negative first derived layer, when a complexity of the first derived layer exceeds a complexity of the negative first derived layer; and
   verifying the circuit design in response to the plurality of derived layers.

5. The method of claim 4, wherein the complexity of an image of the negative first derived layer is calculated in response to a sum of edge lengths in the negative first derived layer; and
   wherein the complexity of an image of the first derived layer is calculated in response to a number of edges in the first derived layer.

6. The method of claim 4, wherein the complexity of an image of the negative first derived layer is calculated in response to a number of trapezoids making-up the negative first derived layer; and
   wherein the complexity of an image of the first derived layer is calculated in response to a number of trapezoids making-up the first derived layer.

7. A computer system including a computer program for enhancing performance of an integrated circuit design verification system, the computer system comprising:
   a computer-readable memory storing:
      a circuit design including a base layer, a first layer and a second layer within the base layer, a first derived layer, and a second derived layer, the first derived layer defined in response to an operation between the base layer and the first layer and the second derived layer defined in response to an operation between the second layer and the first derived layer;
      code that retrieves the first layer;
      code that derives a negative first derived layer in response to the first layer, the negative first derived layer being a negative domain representation of the first derived layer, wherein the operation between the base layer and the first layer and on the negative first derived layer is chosen from the set: AND NOT, XOR, and INSIDENESS; and
      code that verifies tie circuit design in response to the negative first derived layer.

8. The computer system of claim 7, wherein the computer-readable memory also includes:
   code that retrieves the second layer from the memory, the second layer located within the base layer;
   code that derives the second derived layer in response to the negative first derived layer and the second layer, and
   code that verifies the circuit design in response to the second derived layer.

9. The computer system of claim 7, wherein the computer-readable memory also includes:
   code that retrieves the second layer from the memory, the second layer located within the base layer;
   code that derives the negative second derived layer in response to the negative first derived layer and the second layer, and code that verifies the circuit design in response to the negative second derived layer.

10. The computer system of claim 7, wherein the circuit design also includes a plurality of derived layers defined in response to the first derived layer; and wherein the computer-readable memory also includes:

code that derives the plurality of derived layers in response to the negative first derived layer, when a complexity of the first derived layer exceeds a complexity of the negative first derived layer; and code that verifies the circuit design in response to the plurality of derived layers.

11. The computer system of claim 7 wherein the computer-readable memory further includes code that determines a complexity including:

code that calculates a number of edges in the negative first derived layer; and code that calculates a number of edges in the first derived layer.

12. The computer system of claim 7 wherein the computer-readable memory further includes code that determines the complexities including:

code that calculates a number of trapezoids that make-up the negative first derived layer; and code that calculates a number of trapezoids that make-up the first derived layer.

13. A computer system configured to enhance performance of an integrated circuit design verification system, the computer system comprising:

a memory storing a circuit design, the circuit design including a base layer, a first mask layer, a second mask layer, a first derived layer, and a second derived layer, the first derived layer defined in response to an operation between the base layer and the first mask layer and the second derived layer defined in response to an operation between the second mask layer and the first derived layer;

a retriever for retrieving the first layer from the memory, the first layer located within the base layer;

a deriver for deriving a negative first derived layer in response to the first layer, the negative first derived layer being a negative domain representation of the first derived layer;

a first calculator for calculating a complexity of the first derived layer in response to the number of edges in the first derived layer;

a second calculator for calculating a complexity of the negative first derived layer in response to the number of edges in the negative first derived layer; and a verifier for verifying the circuit design in response to the negative first derived layer, when the complexity of the negative first derived layer is less than the complexity of the first derived layer.

14. The computer system of claim 13, further comprising:

a retriever for retrieving the second layer from the memory, the second layer located within the base layer;

a deriver for deriving the second derived layer in response to the negative first derived layer and the second layer and a verifier for verifying the circuit design in response to the second derived layer.

15. The computer system of claim 13, further comprising:

a retriever for retrieving the second layer from the memory, the second layer located within the base layer;

a deriver for deriving a negative second derived layer in response to the negative first derived layer and the second layer and a verifier for verifying the circuit design in response to the negative second derived layer.

16. The computer system of claim 13, wherein the circuit design also includes a plurality of derived layers defined in response to the first derived layer, the computer system further comprising:

a deriver for deriving the plurality of derived layers in response to the negative first derived layer, when a complexity of the first derived layer exceeds a complexity of the negative first derived layer; and a verifier for verifying the circuit design in response to the plurality of derived layers.

17. The computer system of claim 14, wherein the computer system further comprises:

a calculator for calculating a sum of edge lengths in the negative first derived layer; and a calculator for calculating a sum of edge lengths in the first derived layer.

18. The computer system of claim 14, wherein the computer system further comprises:

a calculator for calculating a number of trapezoids making-up the negative first derived layer; and a calculator for calculating a number of trapezoids making-up the first derived layer.

19. The computer system of claim 13, wherein the operation between the second mask layer and the first derived layer is chosen from the set: AND NOT, XOR, and INSIDENESS.

20. A circuit based upon a circuit design verified in accordance to the method claimed in claim 1.

21. An apparatus having a circuit based upon a circuit design verified in accordance to the method claimed in claim 1.

22. A method implemented on a computer system for enhancing performance of an integrated circuit design verification system, the computer system having a memory storing a circuit design, the circuit design including a base layer, a first layer, a second layer, a first derived layer, and a second derived layer, the first derived layer defined in response to an operation between the base layer and the first layer, the second derived layer defined in response to an operation between the second layer and the first derived layer, the method comprising the steps of:

retrieving the first layer from the memory, the first layer located within the base layer;

deriving a negative first derived layer in response to the first derived layer, the negative first derived layer being a negative domain representation of the first derived layer;

determining a complexity of the first derived layer;

determining a complexity of the negative first derived layer; and verifying the circuit design in response to the negative first derived layer, when the complexity of the negative first derived layer is less than the complexity of the first derived layer.

23. The method of claim 22, further comprising the steps of:

retrieving the second layer from the memory, the second layer located within the base layer;

deriving the second derived layer in response to the negative first derived layer and the second layer, and verifying the circuit design in response to the second derived layer.

24. The method of claim 22, further comprising the steps of:

retrieving the second layer from the memory, the second layer located within the base layer;

deriving the negative second derived layer in response to the negative first derived layer and the second layer, and verifying the circuit design in response to the negative second derived layer.

25. The method of claim 22, wherein the circuit design also includes a plurality of derived layers defined in response to the first derived layer, the method further comprising the step of:

deriving the plurality of derived layers in response to the negative first derived layer, when a complexity of the first derived layer exceeds a complexity of the negative first derived layer; and verifying the circuit design in response to the plurality of derived layers.

26. The method of claim 22, wherein the complexity of an image of the negative first derived layer is calculated in response to a sum of edge lengths in the negative first derived layer; and wherein the complexity of an image of the first derived layer is calculated in response to a number of edges in the first derived layer.

27. The method of claim 22, wherein the complexity of an image of the negative first derived layer is calculated in response to a number of trapezoids making-up the negative first derived layer; and wherein the complexity of an image of the first derived layer is calculated in response to a number of trapezoids making-up the first derived layer.

28. The method of claim 22 wherein the complexity of the first derived layer is determined in response to a sum of edge lengths in the first derived layer.

29. The method of claim 22 wherein the complexity of the negative first derived layer is determined in response to a number selected from the set: number of edges in the negative first derived layer, sum of edge lengths in the negative first derived layer, and number of trapezoids making-up the negative first derived layer.

* * * * *